US011960158B2

(12) United States Patent
Eguchi et al.

(10) Patent No.: US 11,960,158 B2
(45) Date of Patent: Apr. 16, 2024

(54) DISPLAY DEVICE

(71) Applicant: SEMICONDUCTOR ENERGY LABORATORY CO., LTD., Atsugi (JP)

(72) Inventors: Shingo Eguchi, Kanagawa (JP); Hideaki Kuwabara, Kanagawa (JP); Kazune Yokomizo, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 18/134,206

(22) Filed: Apr. 13, 2023

(65) Prior Publication Data

US 2023/0251515 A1 Aug. 10, 2023

Related U.S. Application Data

(63) Continuation of application No. 17/889,425, filed on Aug. 17, 2022, now Pat. No. 11,635,647, which is a (Continued)

(30) Foreign Application Priority Data

Aug. 17, 2016 (JP) .................................. 2016-159868

(51) Int. Cl.
*G02F 1/1333* (2006.01)
*G09F 9/30* (2006.01)
(Continued)

(52) U.S. Cl.
CPC ...... *G02F 1/133308* (2013.01); *G02F 1/1333* (2013.01); *G09F 9/30* (2013.01);
(Continued)

(58) Field of Classification Search
CPC ......... H01L 2251/5338; H01L 27/3232; H01L 51/5012; G06F 1/1616; G02F 1/133305; G09F 9/301
See application file for complete search history.

(56) References Cited

U.S. PATENT DOCUMENTS 6,714,268 B2  3/2004  Wang et al.
7,038,641 B2  5/2006  Hirota et al.
(Continued)

FOREIGN PATENT DOCUMENTS

CN  204808127 U  11/2015
CN  105159405 A  12/2015
(Continued)

OTHER PUBLICATIONS

International Search Report (Application No. PCT/IB2017/054750) dated Oct. 31, 2017.
(Continued)

*Primary Examiner* — Mariam Qureshi
(74) *Attorney, Agent, or Firm* — NIXON PEABODY LLP; Jeffrey L. Costellia

(57) ABSTRACT

A semiconductor device including a large display portion with improved portability is provided. The display device includes a first display panel, a second display panel, and an adhesive layer. The area of the second display panel is larger than the area of the first display panel. The first display panel includes a first substrate, a second substrate, and a reflective liquid crystal element and a first transistor each positioned between the first substrate and the second substrate. The second display panel includes a first resin layer having flexibility, a second resin layer having flexibility, and a light-emitting element and a second transistor each positioned between the first resin layer and the second resin layer. The liquid crystal element has a function of reflecting light toward the second substrate side. The light-emitting (Continued)

element has a function of emitting light toward the second resin layer side. The first substrate and part of the second resin layer are bonded to each other with the adhesive layer.

9 Claims, 10 Drawing Sheets

Related U.S. Application Data continuation of application No. 16/928,102, filed on Jul. 14, 2020, now Pat. No. 11,442,302, which is a continuation of application No. 16/324,649, filed as application No. PCT/IB2017/054750 on Aug. 3, 2017, now Pat. No. 10,816,841.

(51) Int. Cl.
| | |
|---|---|
| G09F 9/46 | (2006.01) |
| H01L 29/786 | (2006.01) |
| H05B 33/02 | (2006.01) |
| H10K 50/11 | (2023.01) |
| H10K 59/50 | (2023.01) |
| H05B 33/14 | (2006.01) |
| H05B 33/22 | (2006.01) |
| H10K 102/00 | (2023.01) |

(52) U.S. Cl.
CPC ............... *G09F 9/301* (2013.01); *G09F 9/46* (2013.01); *H01L 29/786* (2013.01); *H01L 29/78603* (2013.01); *H05B 33/02* (2013.01); *H10K 50/11* (2023.02); *H10K 59/50* (2023.02); *H05B 33/14* (2013.01); *H05B 33/22* (2013.01); *H10K 2102/311* (2023.02)

(56) References Cited

U.S. PATENT DOCUMENTS

| | | |
|---|---|---|
| 7,084,936 B2 | 8/2006 | Kato |
| 7,102,704 B2 | 9/2006 | Mitsui et al. |
| 7,106,396 B2 | 9/2006 | Suzuki |
| 7,176,991 B2 | 2/2007 | Mitsui et al. |
| 7,196,751 B2 | 3/2007 | Suzuki |
| 7,239,361 B2 | 7/2007 | Kato |
| 7,248,235 B2 | 7/2007 | Fujii et al. |
| 7,385,654 B2 | 6/2008 | Mitsui et al. |
| 7,674,650 B2 | 3/2010 | Akimoto et al. |
| 8,106,852 B2 | 1/2012 | Fujinawa et al. |
| 8,830,424 B2 | 9/2014 | Hirakata et al. |
| 9,651,998 B2 | 5/2017 | Matsueda |
| 9,905,795 B2 | 2/2018 | Matsueda |
| 10,295,818 B2 | 5/2019 | Nam et al. |
| 10,297,784 B2 | 5/2019 | Matsueda |
| 10,379,577 B2 | 8/2019 | Yeom |
| 11,181,732 B2 | 11/2021 | Nam et al. |
| 2003/0142244 A1 | 7/2003 | Kato |
| 2003/0201960 A1 | 10/2003 | Fujieda |
| 2006/0072047 A1 | 4/2006 | Sekiguchi |
| 2007/0139606 A1 | 6/2007 | Kim et al. |
| 2007/0171332 A1 | 7/2007 | Suzuki |
| 2007/0171333 A1 | 7/2007 | Suzuki |
| 2008/0007486 A1 | 1/2008 | Fujinawa et al. |
| 2008/0180618 A1 | 7/2008 | Fujieda |
| 2010/0164837 A1* | 7/2010 | Kao ................. G06F 1/1616 345/1.3 |
| 2010/0171905 A1 | 7/2010 | Huang et al. |
| 2010/0277443 A1* | 11/2010 | Yamazaki ........... G06F 1/1635 345/204 |
| 2012/0033353 A1 | 2/2012 | Huang |
| 2014/0118221 A1 | 5/2014 | Park et al. |
| 2014/0285992 A1 | 9/2014 | Yang. et al. |
| 2014/0339517 A1 | 11/2014 | Park et al. |
| 2014/0346473 A1 | 11/2014 | Park et al. |
| 2015/0338888 A1 | 11/2015 | Kim et al. |
| 2016/0205792 A1 | 7/2016 | Ahn |
| 2016/0212840 A1* | 7/2016 | Koo ................. G06F 1/1626 |
| 2017/0075389 A1* | 3/2017 | Yeom ................. G06F 3/147 |
| 2017/0082882 A1 | 3/2017 | Hirakata et al. |
| 2017/0123461 A1 | 5/2017 | Kim et al. |
| 2017/0263690 A1 | 9/2017 | Lee et al. |
| 2017/0293171 A1 | 10/2017 | Yamazaki et al. |

FOREIGN PATENT DOCUMENTS

| | | |
|---|---|---|
| CN | 105677084 A | 6/2016 |
| EP | 1826739 A | 8/2007 |
| JP | 63-194382 | 12/1988 |
| JP | 08-211832 A | 8/1996 |
| JP | 2001-066593 A | 3/2001 |
| JP | 2001-092390 A | 4/2001 |
| JP | 2001-305568 A | 10/2001 |
| JP | 2002-196702 A | 7/2002 |
| JP | 2002-328630 A | 11/2002 |
| JP | 2003-076302 A | 3/2003 |
| JP | 2003-098984 A | 4/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2005-215320 A | 8/2005 |
| JP | 2006-243329 A | 9/2006 |
| JP | 2006-287982 A | 10/2006 |
| JP | 2007-096055 A | 4/2007 |
| JP | 2007-123861 A | 5/2007 |
| JP | 2007-232882 A | 9/2007 |
| JP | 2007-256983 A | 10/2007 |
| JP | 4161574 | 10/2008 |
| JP | 3164598 | 12/2010 |
| JP | 2013-221965 A | 10/2013 |
| JP | 2015-106152 A | 6/2015 |
| JP | 2016-015618 A | 1/2016 |
| JP | 2016-038490 A | 3/2016 |
| KR | 2009-0100920 A | 9/2009 |
| WO | WO-2004/053819 | 6/2004 |
| WO | WO-2015/178714 | 11/2015 |

OTHER PUBLICATIONS

Written Opinion (Application No. PCT/IB2017/054750) dated Oct. 31, 2017.

Shieh.H, "Transflective display by Hybrid OLED and LCD", LEOS 2005 (IEEE Lasers and Electro-Optics Society Annual Meeting), Oct. 22, 2005, pp. 650-651, IEEE.

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

FIG. 10A1
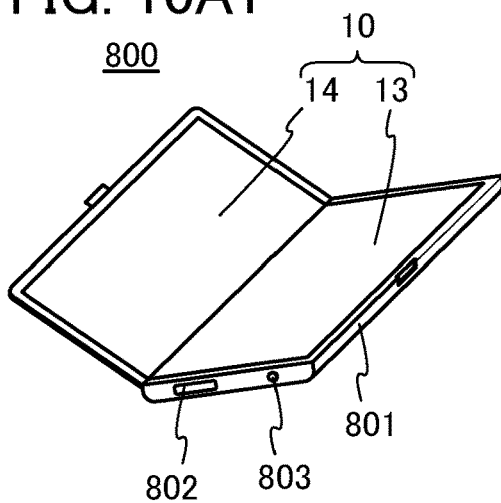
FIG. 10A2
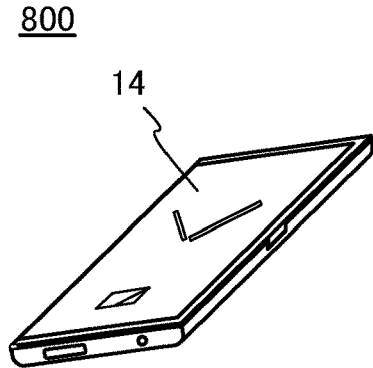
FIG. 10B1
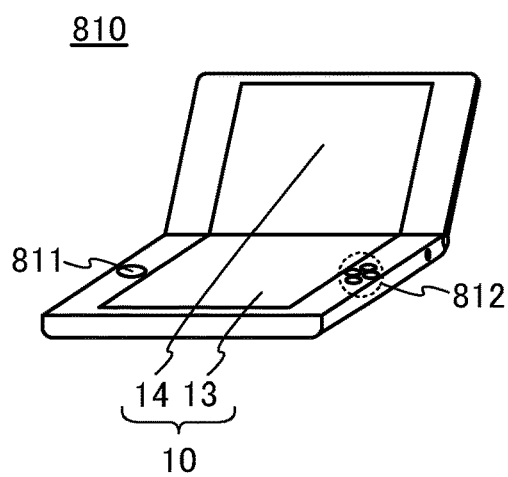
FIG. 10B2
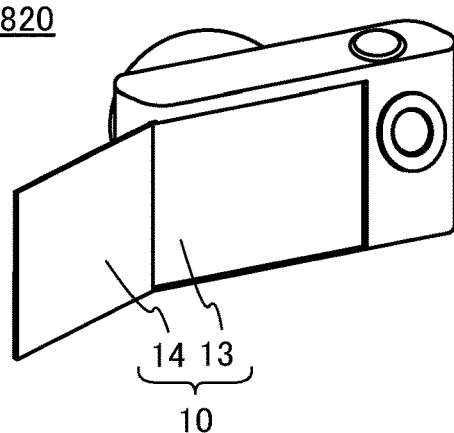
FIG. 10C
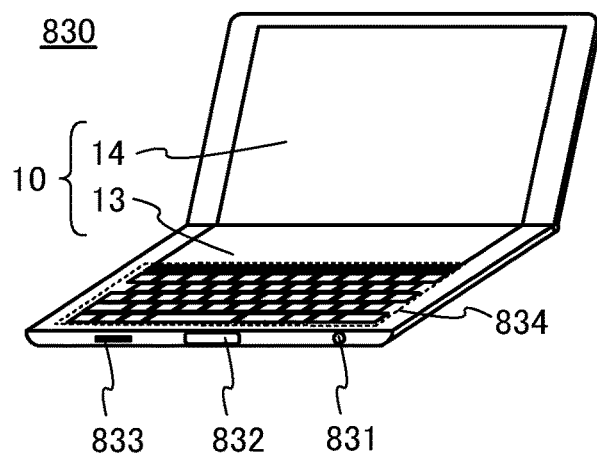

DISPLAY DEVICE

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic appliance, a lighting device, an input device, an input-output device, a driving method thereof, and a manufacturing method thereof.

Note that in this specification and the like, a semiconductor device generally means a device that carries out its function by utilizing semiconductor characteristics. A transistor, a semiconductor circuit, an arithmetic device, a memory device, and the like are embodiments of the semiconductor device. In addition, an imaging device, an electro-optical device, a power generation device (including a thin film solar cell, an organic thin film solar cell, and the like), and an electronic appliance may include a semiconductor device.

BACKGROUND ART

An example of a display device is a liquid crystal display device provided with a liquid crystal element. For example, an active matrix liquid crystal display device, in which pixel electrodes are arranged in matrix and transistors are used as switching elements connected to respective pixel electrodes, has attracted attention.

For example, an active matrix liquid crystal display device in which transistors including a metal oxide in channel formation regions are used as switching elements connected to respective pixel electrodes is known (Patent Document 1 and Patent Document 2).

There are two well-known types of active matrix liquid crystal display devices, a transmissive type and a reflective type.

In a transmissive liquid crystal display device, a backlight such as a cold cathode fluorescent lamp or an LED (Light Emitting Diode) is used, and the optical modulation action of liquid crystal is utilized to select states between a state where light from the backlight passes through liquid crystal to be output to the outside of the liquid crystal display device and a state where the light is not output, whereby a bright or dark image is displayed, and furthermore, bright and dark images are combined to display an image.

In a reflective liquid crystal display device, the optical modulation action of liquid crystal is utilized to select states between a state where external light, that is, incident light is reflected on a pixel electrode to be output to the outside of the device and a state where the incident light is not output, whereby a bright or dark image is displayed, and furthermore, bright and dark images are combined to display an image. As compared with a transmissive liquid crystal display device, a reflective liquid crystal display device does not use a backlight and thus has an advantage of low power consumption.

PRIOR ART DOCUMENT

Patent Document

[Patent Document 1] Japanese Published Patent Application No. 2007-123861

[Patent Document 2] Japanese Published Patent Application No. 2007-096055

SUMMARY OF THE INVENTION

Problems to be Solved by the Invention

Among electronic appliances including the above-described display device, a mobile phone, a smart phone, a tablet terminal, a portable game machine, and the like are particularly required to be compact in size and easy to carry and to have a large display portion for higher visibility.

Since these portable electronic appliances use batteries as the power source, the display devices are required to have low-power consumption as well. In addition, portable electronic appliances are required to have high visibility both in an environment where external light illuminance is high and in an environment where external light illuminance is low.

An object of one embodiment of the present invention is to provide a semiconductor device with a large display portion and improved portability. Another object is to reduce power consumption of a display device. Another object is to display a high-quality video regardless of usage environments. Another object is to provide a foldable display device. Another object is to provide a novel semiconductor device.

Means for Solving the Problems

In order to achieve the above object, one embodiment of the present invention is characterized in including a first display panel and a second display panel, in that the second display panel has a larger area than the first display panel and also has flexibility, and that the first display panel is bonded onto the second display panel.

One embodiment of the present invention is a display device including a first display panel, a second display panel, and an adhesive layer. The area of the second display panel is larger than the area of the first display panel. The first display panel includes a first substrate, a second substrate, a reflective liquid crystal element and a first transistor each positioned between the first substrate and the second substrate. The second display panel includes a first resin layer having flexibility, a second resin layer having flexibility, and a light-emitting element and a second transistor each positioned between the first resin layer and the second resin layer. The liquid crystal element has a function of reflecting light toward the second substrate side. The light-emitting element has a function of emitting light toward the second resin layer side. The first substrate and part of the second resin layer are bonded to each other with the adhesive layer.

In the above, the second display panel may include a first display portion and a second display portion. A display portion of the first display panel may overlap with the first display portion of the second display panel.

In the above, the first display portion and the second display portion included in the second display panel preferably share a wiring.

In the above, an input device is preferably provided over the first display panel.

In the above, each channel of the first transistor and the second transistor is preferably formed in a metal oxide.

In the above, the first substrate and the second substrate included in the first display panel are preferably glass substrates.

In the above, the light-emitting element included in the second display panel preferably has a function of emitting light also toward the first resin layer side.

Effect of the Invention

According to one embodiment of the present invention, a display device having improved portability and a large display portion can be provided. Power consumption of a display device can be reduced. A high-quality video can be displayed regardless of usage environments. A foldable display device can be provided. A novel semiconductor device can be provided.

BRIEF DESCRIPTION OF THE DRAWINGS

FIG. 4A to FIGS. 4B2 Specific cross-sectional views of a display device of one embodiment of the present invention.

FIG. 8A to FIGS. 8B2 A structure example of a display device of one embodiment of the present invention.

FIGS. 10A1 to FIG. 10C Examples of an electronic appliance including a display device of one embodiment of the present invention.

MODE FOR CARRYING OUT THE INVENTION

Figure 1A:
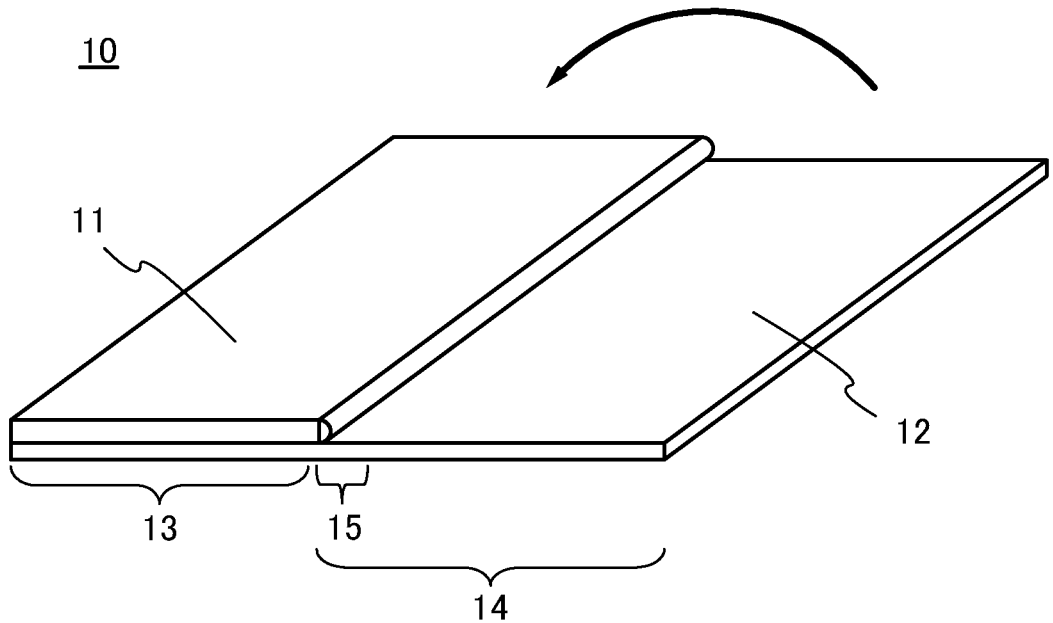
FIG. 1A and FIG. 1B Perspective views of a display device of one embodiment of the present invention.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number.

A transistor is a kind of semiconductor elements and can perform amplification of current or voltage, switching operation for controlling conduction or non-conduction, or the like. A transistor in this specification includes an IGFET (Insulated Gate Field Effect Transistor) and a thin film transistor (TFT).

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is to say, a metal oxide that has at least one of an amplifying function, a rectifying function, and a switching function can be referred to as a metal oxide semiconductor, or OS for short. An OS FET refers to a transistor containing a metal oxide or an oxide semiconductor.

In this specification and the like, a metal oxide containing nitrogen is also referred to as a metal oxide in some cases. Moreover, a metal oxide containing nitrogen may be referred to as a metal oxynitride.

In this specification and the like, CAAC (c-axis aligned crystal) or CAC (cloud aligned complementary) might be stated. Note that CAAC refers to an example of a crystal structure, and CAC refers to an example of a function or a material composition.

In this specification and the like, a CAC-OS or a CAC-metal oxide has a conducting function in a part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

In this specification and the like, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of such a component, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC-metal oxide is used in a channel region of a transistor, high current drive capability in the on state of the transistor, that is, a high on-state current and high field-effect mobility, can be obtained.

In other words, the CAC-OS or the CAC-metal oxide can also be called a matrix composite or a metal matrix composite.

Embodiment 1

In this embodiment, examples of a structure and a material of a display device of one embodiment of the present invention are described with reference to FIG. 1 to FIG. 7.

Structure Example 1

A display device 10 which is one embodiment of the present invention includes, as shown in FIG. 1(A), a first display panel 11 provided with a display portion including a reflective liquid crystal element, and a second display panel 12 provided with a display portion including a light-emitting element. The first display panel 11 is bonded to part of the second display panel 12. The reflective liquid crystal elements included in the first display panel 11 can produce gray levels by controlling the amount of reflected light. The light-emitting elements included in the second display panel 12 can produce gray levels by controlling the amount of light emission.

The area of the second display panel 12 is larger than the area of the first display panel 11. Note that in this specification and the like, the area of a display panel means the area of the largest plane of a substrate or a resin layer of the display panel.

Since the area of the second display panel 12 is larger than the area of the first display panel 11, the display device 10 includes an overlap region 13 in which the first display panel 11 and the second display panel 12 overlap each other, and a non-overlap region 14 only including the second display panel.

The second display panel 12 is a display panel having flexibility. Since the second display panel 12 has flexibility, the non-overlap region 14 can be bent.

Figure 1B:
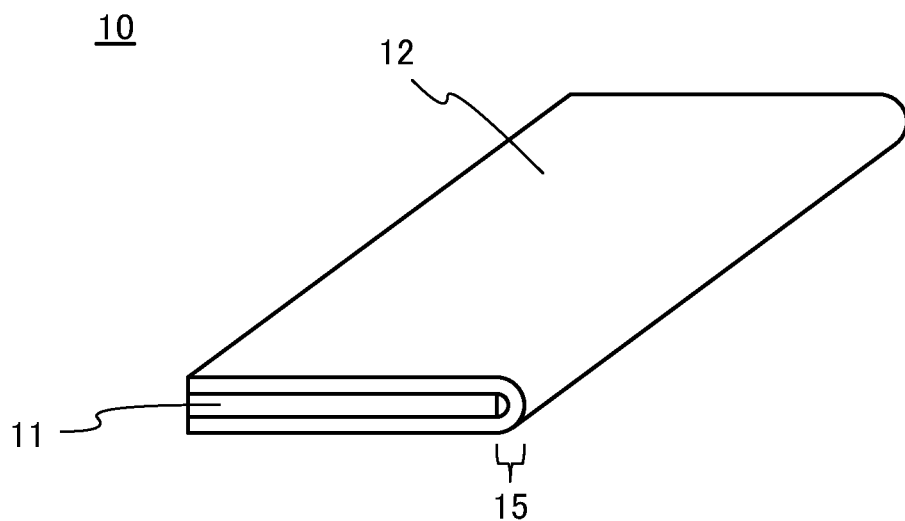

As shown in FIG. 1(B), when part of the non-overlap region 14, for example, a bent portion 15, is curved, the non-overlap region 14 and the overlap-region 13 can overlap each other.

By overlapping the non-overlap region 14 and the overlap-region 13, the portability of an electronic appliance including the display device 10 can be increased.

In the display device 10 shown in FIG. 1, the area of the overlap region 13 is approximately the same as the area of the non-overlap region 14, and the non-overlap region 14 is provided on one side of the overlap region 13; however, one embodiment of the present invention is not limited to this. The non-overlap region 14 may be larger or smaller than the overlap region 13. The non-overlap region 14 is preferably larger because the display device can have a large display portion. The non-overlap region 14 may be provided anywhere as long as it is adjacent to the overlap region 13.

Figure 2A:
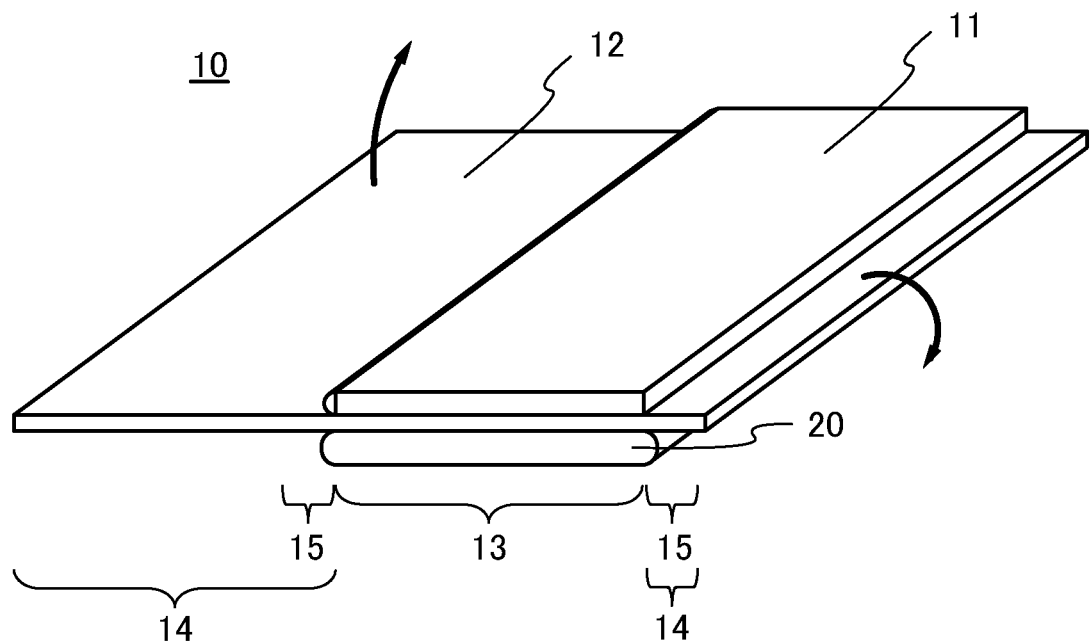
FIG. 2A and FIG. 2B Perspective views of a display device of one embodiment of the present invention.
Figure 2B:
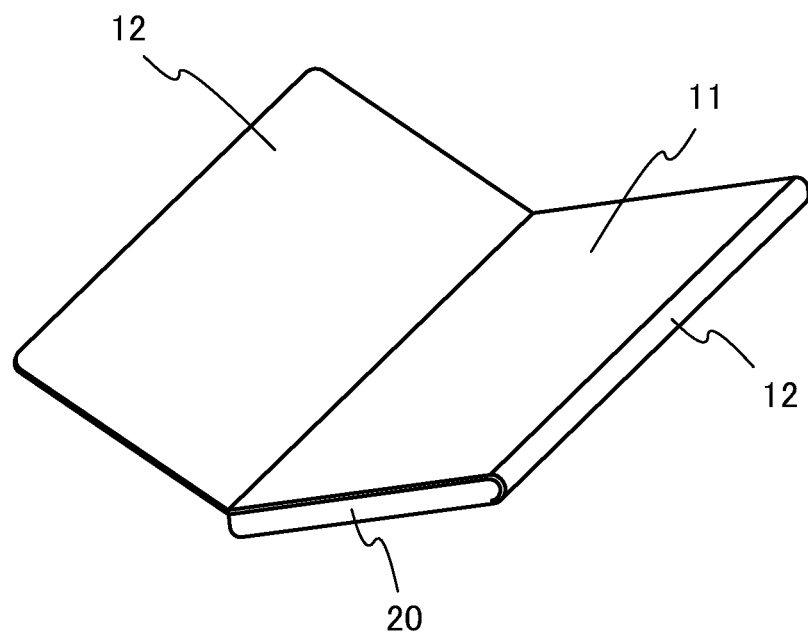

For example, as shown in FIG. 2(A), the display device 10 may have the non-overlap region 14 which is larger than the overlap region 13 and is adjacent to both sides of the overlap regions 13. In that case, as shown in FIG. 2(B), the display device 10 can be bent twice so that part of the non-overlap region 14 is provided along a housing 20.

Figure 3A:
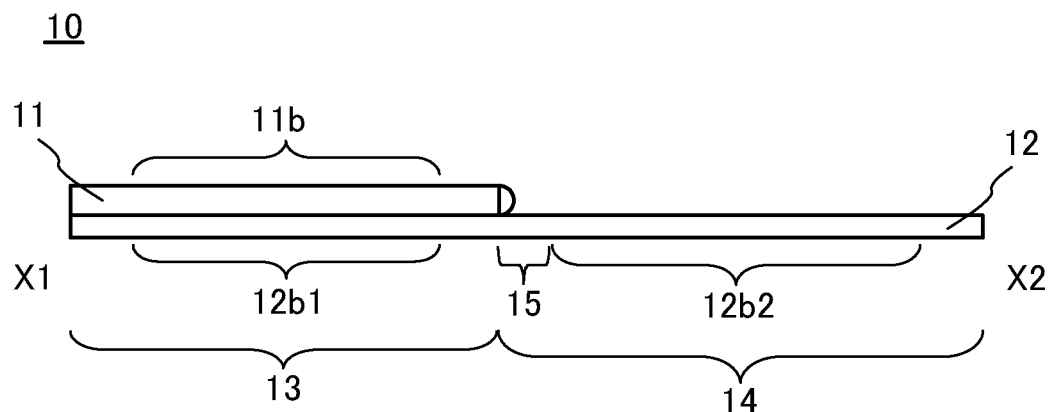
FIG. 3A and FIG. 3B A cross-sectional view and a top view of a display device of one embodiment of the present invention.
Figure 3B:
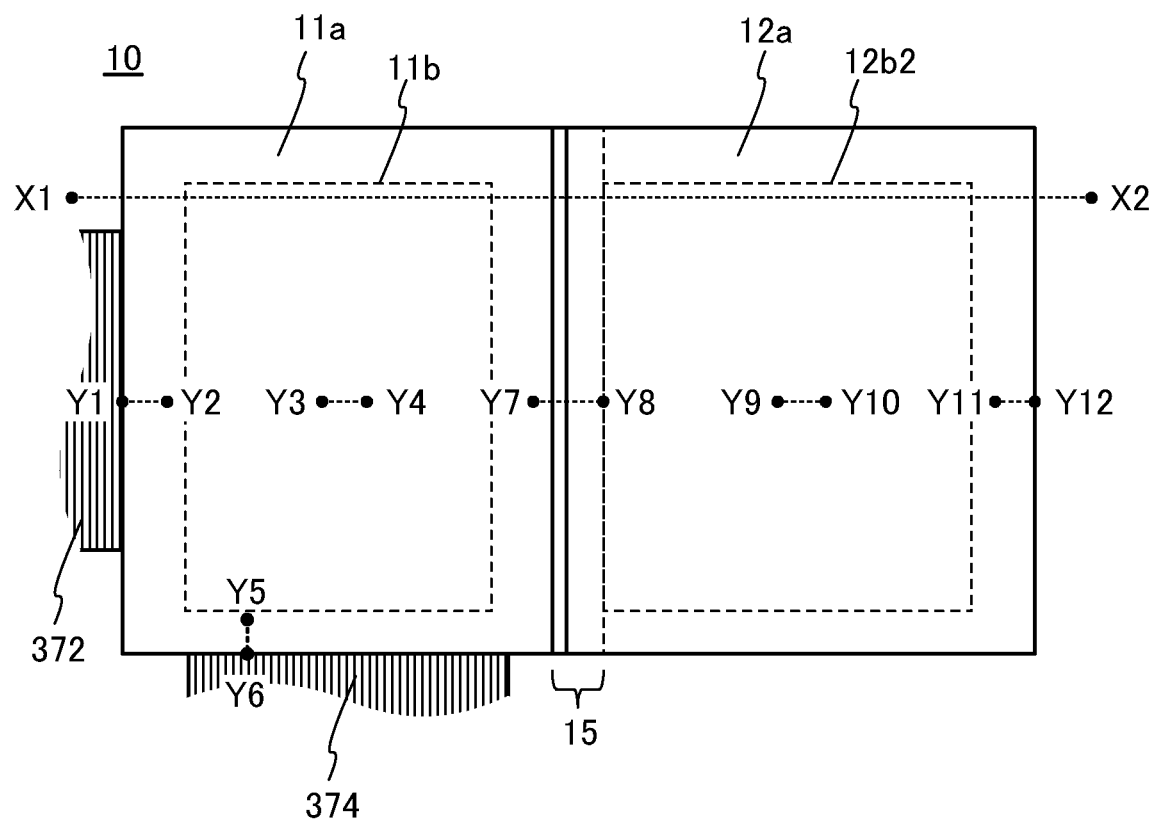

Next, the structure of the display device 10 shown in FIG. 1 will be explained. FIG. 3 shows a simplified cross-sectional view and a top view of the display device 10 shown in FIG. 1. FIG. 3(A) is a cross-sectional view along dotted line X1-X2 in FIG. 3(B).

As shown in FIGS. 3(A) and (B), the first display panel 11 includes a peripheral portion 11a and a display portion 11b. The second display panel 12 includes a peripheral portion 12a and a display portion.

The display portion of the second display panel 12 can be divided into a plurality of portions. In this embodiment, an example in which the display portion of the second display panel 12 is divided into a first display portion 12b1 and a second display portion 12b2 as shown in FIG. 3(B) is explained. The display portion 11b of the first display panel overlaps with the first display portion 12b1 of the second display panel.

In the display device 10, the overlap region 13 including the display portion 11b and the display portion 12b1 can perform display by utilizing only light reflected by a liquid crystal element included in the display portion 11b, for example. In addition, the overlap region 13 can perform display by utilizing only light emitted from a light-emitting element included in the display portion 12b1. Furthermore, the overlap region 13 can perform display by utilizing both of the reflected light and the light from a light-emitting element.

Since the overlap region 13 includes the display portion 11b and the display portion 12b1, display can be performed by utilizing light reflected by a liquid crystal element under an environment with strong external light, and by utilizing light from a light-emitting element under an environment with weak external light, for example. In this manner, by switching display depending on the intensity of external light, high visibility can be obtained under any environment. When both of the reflected light and the light from a light-emitting element is utilized, high display quality can be obtained.

In the display device 10, the non-overlap region 14 including the display portion 12b2 can perform display by utilizing light from a light-emitting element.

Light from the light-emitting element included in the display portion 12b1 and the display portion 12b2 may be extracted from only one surface of the second display panel 12, for example, toward the first display panel 11 side. Alternatively, the light may be extracted from both surfaces of the second display panel 12.

When the light is extracted from both surfaces of the second display panel 12, text and the like can be displayed on the viewing side of the second display panel 12 even when the non-overlap region 14 is bent to overlap with the overlap region 13 as shown in FIG. 1(B). When light from the light-emitting element included in the display portion 12b2 is capable of being extracted from both surfaces of the panel, the light-emitting element may be configured to perform color display on one surface, for example, the surface on the first display panel 11 side, but not to perform color display on the other surface.

The first display panel 11 is electrically connected to an FPC 372. The second display panel 12 is electrically connected to an FPC 374.

Figure 4A:
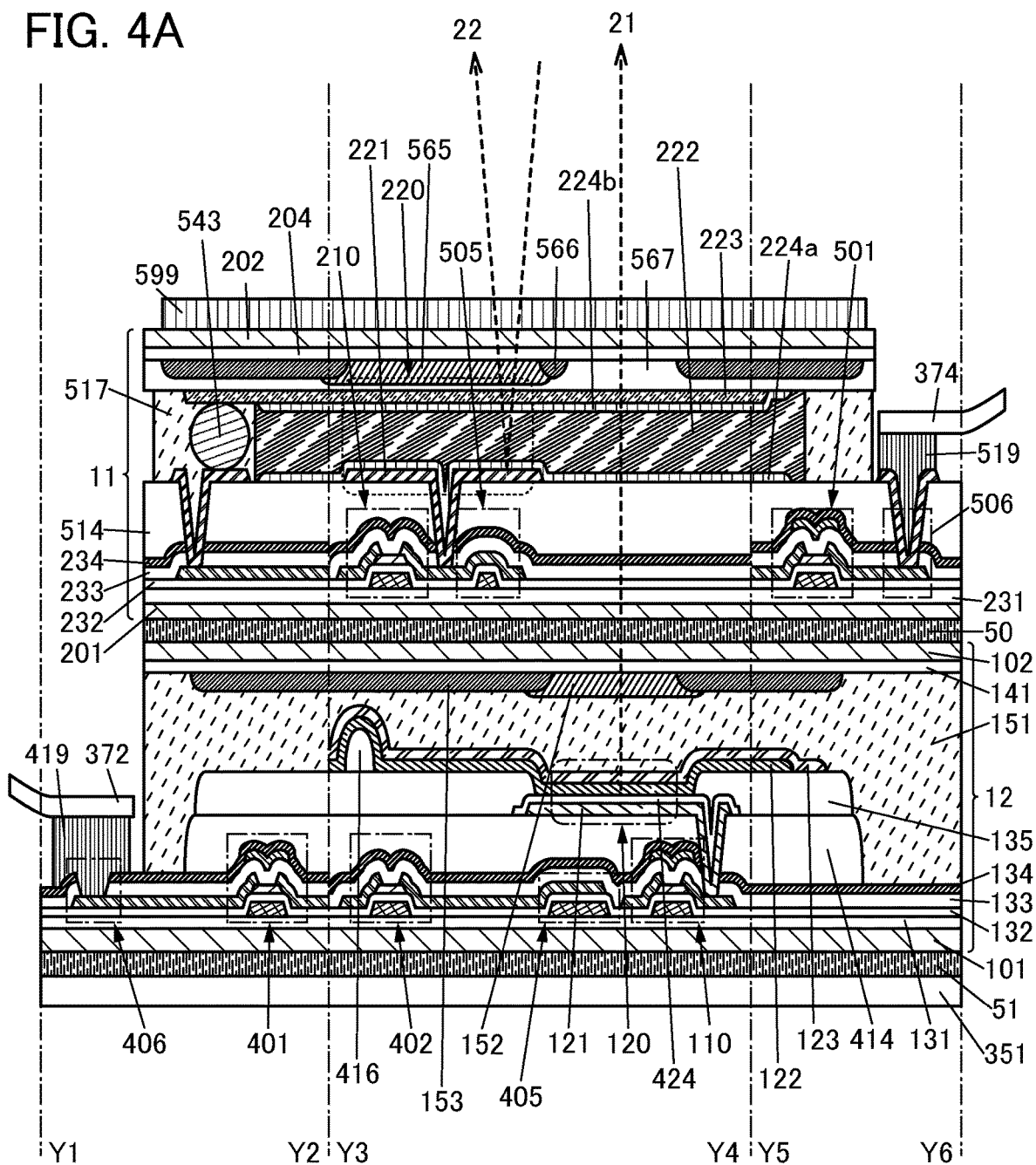
Figure 5:
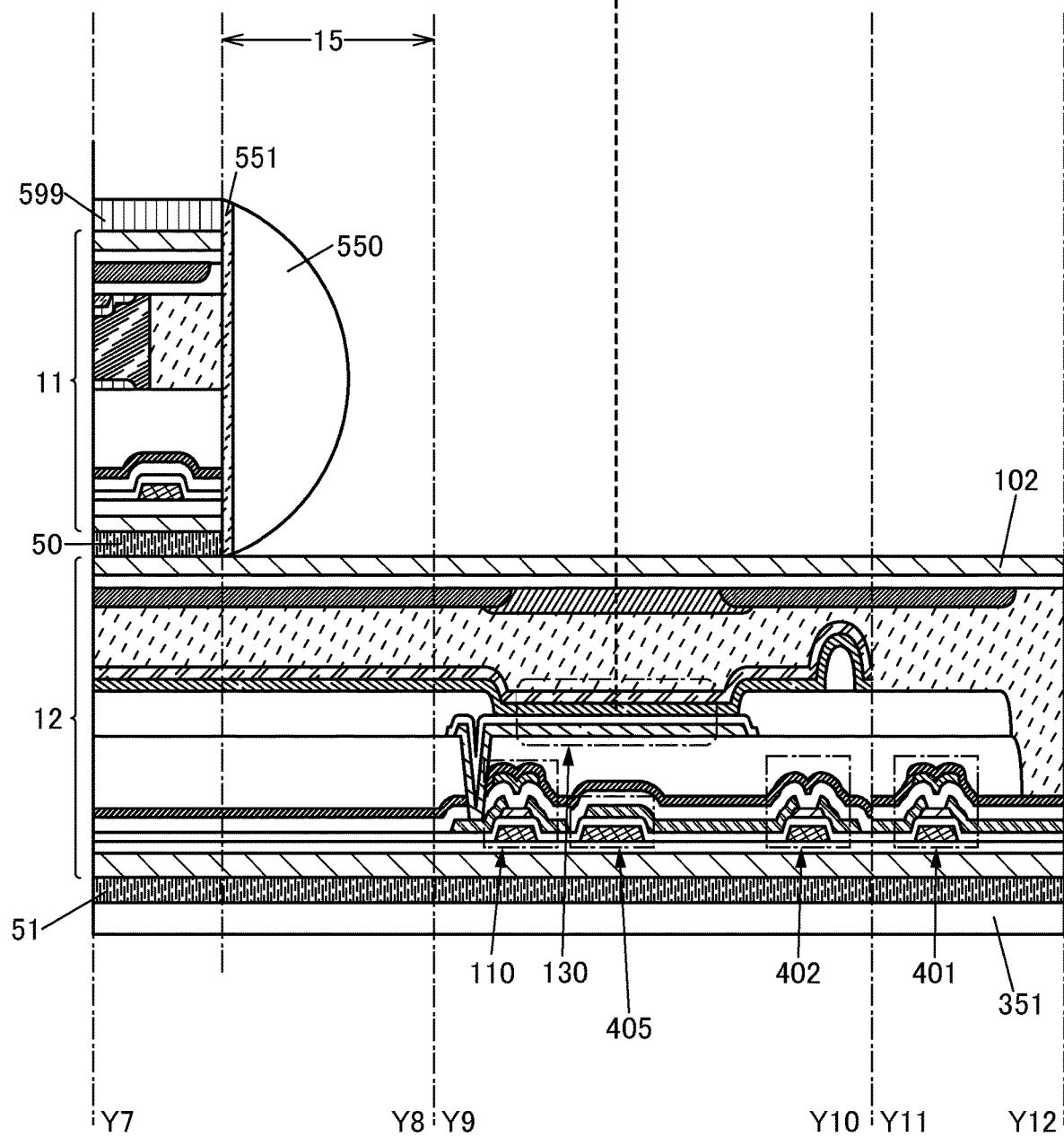
FIG. 5 A specific cross-sectional view of a display device of one embodiment of the present invention.
Figure 6:
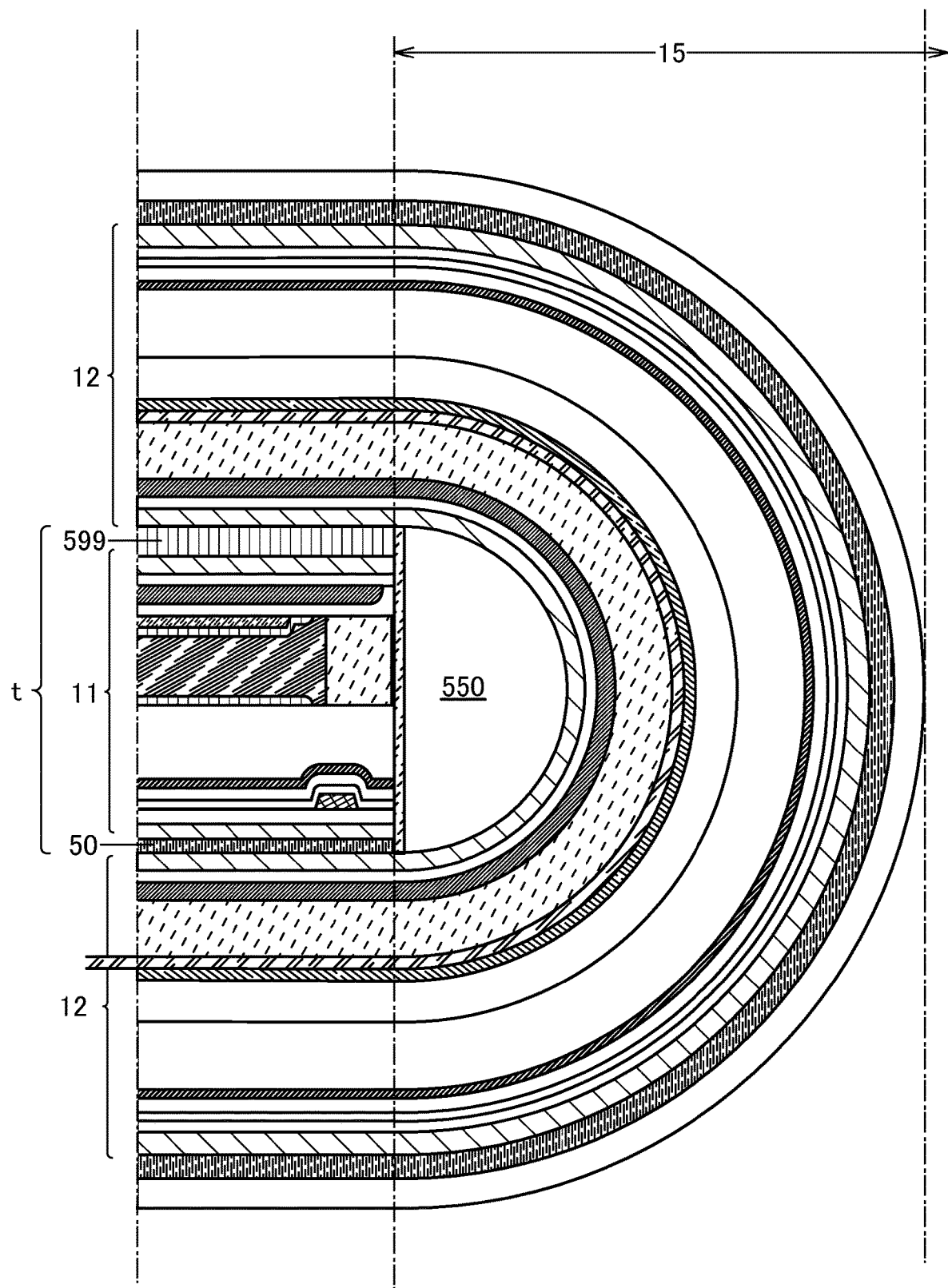
FIG. 6 A specific cross-sectional view of a display device of one embodiment of the present invention.

FIG. 4(A) shows a specific cross-sectional view along dotted lines Y1-Y2, Y3-Y4, and Y5-Y6 in FIG. 3(B). FIG. 5 shows a specific cross-sectional view along dotted lines Y7-Y8, Y9-Y10, and Y11-Y12 in FIG. 3(B). FIG. 6 shows a cross-sectional view of the bent portion 15 when the non-overlap region 14 is bent at the bent portion 15.

The structure of the display device 10 is described in more detail with reference to FIG. 4 and FIG. 5.

The display device 10 has a structure in which the first display panel 11 and the second display panel 12 are bonded to each other with an adhesive layer 50.

The first display panel 11 includes a transistor 210 and a liquid crystal element 220 between a substrate 201 and a substrate 202. The second display panel 12 includes a transistor 110, a light-emitting element 120, and a light-emitting element 130 between a resin layer 101 and a resin layer 102. The resin layer 101 is bonded to a substrate 351 with an adhesive layer 51 positioned therebetween. In addition, the substrate 202 includes a polarizing plate 599 on the opposite side to the liquid crystal element 220.

[First Display Panel 11]
<Structure>

The substrate 201 is provided with the transistor 210, a capacitor 505, a transistor 501, a conductive layer 221, an alignment film 224a, an insulating layer 231, an insulating layer 232, an insulating layer 233, an insulating layer 234, an insulating layer 514, and the like. The substrate 202 is provided with an insulating layer 204, a conductive layer 223, an alignment film 224b, and the like. An insulating layer 567 is provided between the substrate 202 and the conductive layer 223. A liquid crystal 222 is sandwiched between the alignment film 224a and the alignment film 224b. A coloring layer 565 for coloring light reflected by the liquid crystal element 220 may be provided. The substrate 201 and the substrate 202 are bonded to each other with the adhesive layer 517.

Figure 4A:
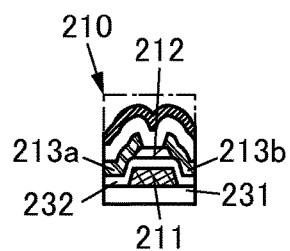
Figure 4A:
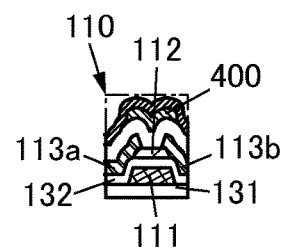

Part of the transistor 210 is illustrated in FIG. 4(B1). The transistor 210 includes a conductive layer 211 provided over the insulating layer 231 and serving as a gate electrode, part of the insulating layer 232 serving as a gate insulating layer, a semiconductor layer 212, a conductive layer 213a serving as one of a source electrode and a drain electrode, and a conductive layer 213b serving as the other of the source electrode and the drain electrode. The conductive layer 213b is electrically connected to one electrode of the capacitor 505.

The insulating layer 233, the insulating layer 234, and the insulating layer 514 cover the transistor 210. The insulating layer 514 serves as a planarization layer.

The liquid crystal element 220 includes the conductive layer 221, the conductive layer 223, and the liquid crystal 222 positioned therebetween. The conductive layer 221 has a function of reflecting visible light, and the conductive layer 223 has a function of transmitting visible light. Therefore, the liquid crystal element 220 is a reflective liquid crystal element.

The conductive layer 221 is electrically connected to the conductive layer 213b through an opening provided in the insulating layer 514, the insulating layer 234, and the insulating layer 233. The alignment film 224a covers surfaces of the conductive layer 221 and the insulating layer 514.

A connection portion 506 is provided in a region near an end portion of the substrate 201. The connection portion 506 is electrically connected to the FPC 374 through a connection layer 519.

The conductive layer 223 is electrically connected to a conductive layer on the substrate 201 side through a connector 543. Thus, a potential or a signal can be supplied to the conductive layer 223 from the FPC 374, an IC, or the like provided on the substrate 201 side. The connector 543 is preferably provided so as to be covered with the adhesive layer 517.

As shown in FIG. 5, a resin 550 is preferably provided at an end portion of the first display panel 11 that is on the bent portion 15 side. The resin 550 has a function of protecting the end portion of the first display panel 11 and the second display panel 12 when the non-overlap region 14 is bent. The resin 550 is bonded to the end portion of the first display panel 11 with an adhesive 551.

A surface of the resin 550 in contact with the second display panel 12 preferably includes a curved surface. As shown in FIG. 6, when the sum of thicknesses of the first display panel 11 and its attachments is represented by t, a curvature radius of the curved surface of the resin 550 is preferably larger than or equal to t/2, for example. For another example, the resin 550 may have a shape obtained by cutting part of a cylinder with a diameter of t and a height equal to one side of the first display panel 11.

In the structure shown in FIG. 5 and FIG. 6, the sum of thicknesses t of the first display panel 11 and its attachments means the total thickness of components from the polarizing plate 599 to the adhesive layer 50.

When the resin 550 is provided, as shown in FIG. 6, the non-overlap region 14 can be bent without damaging the first display panel 11 and the second display panel 12.

Note that the resin 550 does not necessarily have a curved surface in the case where the end portion of the first display panel 11 is not in contact with the second display panel 12 even when the non-overlap region 14 is bent. The resin 550 is not necessarily provided.

<Material>

For the substrate 201 and the substrate 202 included in the first display panel 11, an inorganic material such as glass, quartz, ceramics, or sapphire can be used. Examples of glass include alkali-free glass, barium borosilicate glass, and aluminoborosilicate glass. When glass, quartz, ceramics, or sapphire is used for the substrate 201 and the substrate 202, the overlap region 13 can have high heat resistivity and high intensity.

For the substrate 201 and the substrate 202, a polyimide resin, an acrylic resin, an epoxy resin, a polyamide resin, a polyimide-amide resin, a siloxane resin, a benzocyclobutene-based resin, a phenol resin, or the like may be used. A resin typified by a polyimide resin is preferably used for the substrate 201, in which case the heat resistance and weatherability can be improved compared to other resins.

The insulating layer 231 can be used as a barrier layer that prevents impurities contained in the substrate 201 from diffusing into a transistor or a light-emitting element to be formed later. Therefore, it is preferable to use a material having a high barrier property.

For the insulating layer 231, an inorganic insulating material such as a silicon nitride film, a silicon oxynitride film, a silicon oxide film, a silicon nitride oxide film, an aluminum oxide film, or an aluminum nitride film can be used. Two or more of these insulating films may be stacked. It is particularly preferable to use a silicon nitride film and a silicon oxide film stacked in this order from the substrate 201 side.

The semiconductor layer 212 preferably contains a metal oxide. In particular, a metal oxide having a wider band gap than silicon is preferably used. The use of a semiconductor material having a wider band gap and a lower carrier density than silicon is preferable because off-state current of the transistor can be reduced.

As the metal oxide, a material having a band gap of greater than or equal to 2.5 eV, preferably greater than or equal to 2.8 eV, further preferably greater than or equal to 3.0 eV is preferably used. With use of such a metal oxide, in light (e.g., laser light) irradiation in the separation process to be described later, the light passes through the metal oxide film and thus electrical characteristics of the transistor are less likely to be adversely affected.

When the metal oxide of the semiconductor layer 212 includes a larger number of crystal parts having orientation, like CAAC, the semiconductor layer 212 can be electrically stabilized. In particular, a transistor including a metal oxide that contains both crystal parts having orientation in a thickness direction (also referred to as a film surface direction, or a direction perpendicular to a formation surface or a surface of a film) and randomly aligned crystal parts having no such orientation can have more stable electrical characteristics and a smaller channel length, for example. On the other hand, a transistor including a metal oxide that contains only crystal parts having no orientation, like CAC, can have high field-effect mobility. Note that as described below, a reduction in oxygen vacancies in a metal oxide can achieve a transistor with high field-effect mobility and highly stable electrical characteristics.

It is preferable to use an oxide insulating film such as a silicon oxide film or a silicon oxynitride film for the insulating layer 233. When an oxide insulating film is used as the insulating layer which is in contact with the semiconductor layer 212, oxygen can be supplied to the semiconductor layer 212. As a result, oxygen vacancies in the semiconductor layer 212 can be filled and defects at the interface between the semiconductor layer 212 and the insulating layer 233 can be repaired, leading to a reduction in defect states. Accordingly, an extremely highly reliable semiconductor device can be fabricated.

As the insulating layer 234 stacked over the insulating layer 233, it is preferable to use an aluminum oxide film, a silicon nitride film, or the like, which is an insulating film through which oxygen is less likely to be diffused and transmitted.

The insulating layer 514 is a layer including a formation surface of a display element formed in a later step and thus preferably functions as a planarization layer. For the insulating layer 514, an inorganic insulating material such as a silicon nitride film, a silicon oxynitride film, a silicon oxide film, a silicon nitride oxide film, an aluminum oxide film, or an aluminum nitride film can be used. Two or more of these insulating films may be stacked. An organic insulating material and an inorganic insulating material may be stacked and used for the insulating layer 514. As the organic insulating material, an organic resin such as an epoxy resin, an acrylic resin, a silicone resin, a phenol resin, a polyimide resin, an imide resin, a PVC (polyvinyl chloride) resin, a PVB (polyvinyl butyral) resin, or an EVA (ethylene vinyl acetate) resin can be used.

The insulating layer 204 can be used as a barrier layer that prevents diffusion of impurities contained in the substrate 202. Therefore, it is preferable to use a material having a high barrier property. The description of the insulating layer 231 can be referred to for the material of the insulating layer 204.

The conductive layer 223 has a function of transmitting visible light. As the conductive layer 223, an indium oxide-tin oxide ($In_2O_3$—$SnO_2$, abbreviated as ITO), indium tin oxide containing silicon or silicon oxide, indium zinc oxide, zinc oxide, or the like can be used.

The light-blocking layer 566 can be formed using a metal material or a resin material containing a pigment or dye. The coloring layer 565 can be formed using a resin material containing a pigment or dye.

As the connector 543, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 543, a material capable of elastic deformation or plastic deformation is preferably used. The connector 543, which is the conductive particle, has a shape that is vertically crushed in some cases. In that case, the contact area between the connector 543 and a conductive layer electrically connected to the connector 543 can be increased, thereby reducing contact resistance and suppressing problems such as disconnection.

[Second Display Panel 12]
<Structure>

The resin layer 101 is provided with the transistor 110, a capacitor 405, a transistor 402, a transistor 401, the light-emitting element 120, the light-emitting element 130, an insulating layer 131, an insulating layer 132, an insulating layer 133, an insulating layer 134, an insulating layer 414, an insulating layer 135, a spacer 416, an optical adjustment layer 424, and the like. The resin layer 102 is provided with a light-blocking layer 153, a coloring layer 152, and the like. The resin layer 101 and the resin layer 102 are bonded to each other using an adhesive layer 151.

The light-emitting element 120 is provided in the overlap region 13. The light-emitting element 130 is provided in the non-overlap region 14. The light-emitting element 130 provided in the non-overlap region can be a light-emitting element having a larger area than the light-emitting element 120.

Part of the transistor 110 is illustrated in FIG. 4(B2). The transistor 110 is provided over the insulating layer 131 and includes a conductive layer 111 serving as a gate electrode, part of the insulating layer 132 serving as a gate insulating layer, a semiconductor layer 112, a conductive layer 113a serving as one of a source electrode and a drain electrode, and a conductive layer 113b serving as the other of the source electrode and the drain electrode. The transistor 110 may include a conductive layer 400 serving as a backgate electrode.

The insulating layer 133, the insulating layer 134, and the insulating layer 414 are provided to cover the transistor 110. It is preferable that the insulating layer 133 and the insulating layer 134 be insulating layers including aluminum oxide to improve their barrier properties. For example, it is preferable that an aluminum oxide film formed by a sputtering method and an aluminum oxide film formed by an ALD (Atomic Layer Deposition) method be used for the insulating layer 133 and the insulating layer 134, respectively, to improve their coverage and barrier properties. The insulating layer 414 serves as a planarization layer.

The light-emitting element 120 and the light-emitting element 130 each have a structure in which a conductive layer 121, an EL layer 122, and a conductive layer 123 are stacked. The conductive layer 121 has a function of reflecting visible light, and the conductive layer 123 has a function of transmitting visible light.

The light-emitting element 120 and the light-emitting element 130 may have a microcavity structure including the optical adjustment layer 424. With the combination of the microcavity structure and the coloring layer 152, light with high color purity can be extracted. The thickness of the optical adjustment layer 424 is made to vary depending on the color of the pixel.

The conductive layer 121 is electrically connected to the conductive layer 113b through an opening provided in the insulating layer 414, the insulating layer 134, and the insulating layer 133. The insulating layer 135 covers an end portion of the conductive layer 121 and is provided with an opening that exposes a top surface of the conductive layer 121. The EL layer 122 and the conductive layer 123 are provided in this order to cover the insulating layer 135 and the exposed portion of the conductive layer 121.

An insulating layer 141 is provided on the resin layer 101 side of the resin layer 102. The light-blocking layer 153 and the coloring layer 152 are provided on the resin layer 101 side of the insulating layer 141. The coloring layer 152 is provided in a region overlapping with the light-emitting element 120 or the light-emitting element 130. The light-blocking layer 153 includes an opening in a portion overlapping with the light-emitting element 120 or the light-emitting element 130.

The connection portion 406 is provided in a region near an end portion of the resin layer 101. The connection portion 406 is electrically connected to the FPC 372 through the connection layer 419.

<Material>

For the resin layer 101, a polyimide resin, an acrylic resin, an epoxy resin, a polyamide resin, a polyimide-amide resin, a siloxane resin, a benzocyclobutene-based resin, a phenol resin, or the like can be used. In particular, a resin typified by a polyimide resin is preferably used for the resin layer 101, in which case the heat resistance and weatherability can be improved. The thickness of the resin layer 101 is preferably greater than or equal to 0.01 μm and less than 10 μm, further preferably greater than or equal to 0.1 μm and less than or equal to 3 μm, and still further preferably greater than or equal to 0.5 μm and less than or equal to 1 μm. The thermal expansion coefficient of the resin layer 101 is preferably greater than or equal to 0.1 ppm/° C. and less than or equal to 20 ppm/° C., and further preferably greater than or equal to 0.1 ppm/° C. and less than or equal to 10 ppm/° C. The lower the thermal expansion coefficient of the resin layer 101 is, the more the breakage of the transistor or the like by stress caused by expansion or contraction due to heating can be suppressed.

In the case where a metal oxide is used as the semiconductor layer 112 in the transistor 110, the semiconductor layer 112 can be formed at a low temperature, so that high heat resistance is not required of the resin layer 101. The heat resistance of the resin layer 101 or the like can be evaluated by, for example, weight loss percentage due to heating, specifically 5% weight loss temperature. The 5% weight loss temperature of the resin layer 101 or the like is lower than or equal to 450%, preferably lower than or equal to 400° C., further preferably lower than 400° C., still further preferably lower than 350° C. In addition, the highest temperature in the process for forming the transistor 110 or the like is preferably lower than or equal to 350° C.

The insulating layer 131 can be used as a barrier layer that prevents impurities contained in the resin layer 101 from diffusing into a transistor or a light-emitting element to be formed later. Therefore, it is preferable to use a material having a high barrier property. In the case where the resin layer 101 has an uneven surface, the insulating layer 131 preferably covers the unevenness. The insulating layer 131 may function as a planarization layer that fills the unevenness. It is preferable to use a stack including an organic insulating material and an inorganic insulating material for the insulating layer 131, for example. The description of the insulating layer 514 can be referred to for the material that can be used for the insulating layer 131.

The semiconductor layer 112 preferably contains a metal oxide. The description of the semiconductor layer 212 can be referred to for the material that can be used for the semiconductor layer 112.

An oxide insulating film is preferably used for the insulating layer 133. The description of the insulating layer 233 can be referred to for the material that can be used for the insulating layer 133.

The description of the insulating layer 234 can be referred to for the material that can be used for the insulating layer 134 stacked over the insulating layer 133.

The insulating layer 414 is a layer including a formation surface of a display element formed in a later step and thus is preferably a layer which functions as a planarization layer. The description of the insulating layer 514 can be referred to for the material that can be used for the insulating layer 414.

The description of the insulating layer 514 can also be referred to for the material that can be used for the insulating layer 135.

The insulating layer 141 can be used as a barrier layer that prevents diffusion of impurities contained in the resin layer 102. Therefore, it is preferable to use a material having a high barrier property. The description of the insulating layer 231 can be referred to for the material of the insulating layer 141.

A material which transmits visible light is used for the conductive layer 123. The description of the conductive layer 223 can be referred to for the material that can be used for the conductive layer 123.

The light-blocking layer 153 can be formed using a metal material or a resin material containing a pigment or dye. The coloring layer 152 can be formed using a resin material containing a pigment or dye.

A curable material is preferably used for the adhesive layer 151. For example, a photocurable resin, a reactive curable resin, a thermosetting resin, or the like can be used. In particular, a resin material containing no solvent is preferably used.

[Display Device 10]

The overlap region 13 of the display device 10 includes a portion where the light-emitting element 120 does not overlap with the reflective liquid crystal element 220 when seen from above. Thus, light 21 that is colored by the coloring layer 152 is emitted from the light-emitting element 120 to the viewing side as shown in FIG. 4(A). Furthermore, the reflected light 22 that is external light reflected by the conductive layer 221 is emitted through the liquid crystal 222 and the coloring layer 565 of the liquid crystal element 220.

Although the structure in which the polarizing plate 599 is provided over the substrate 202 is shown in FIG. 4, one embodiment of the present invention is not limited to this. A circularly polarizing plate may be provided over the substrate 202. A polarizing plate or a circularly polarizing plate may be provided below the substrate 202.

Although the structure for color display in which the first display panel 11 includes a coloring layer is explained here, a structure in which a coloring layer is not provided over the first display panel 11 and color display is not performed may be used.

Structure Example 2

An input device such as a touch panel may be provided over the first display panel 11 of the display device 10. The convenience to users of an electronic appliance using the display device 10 provided with the input device can be improved.

Figure 7:
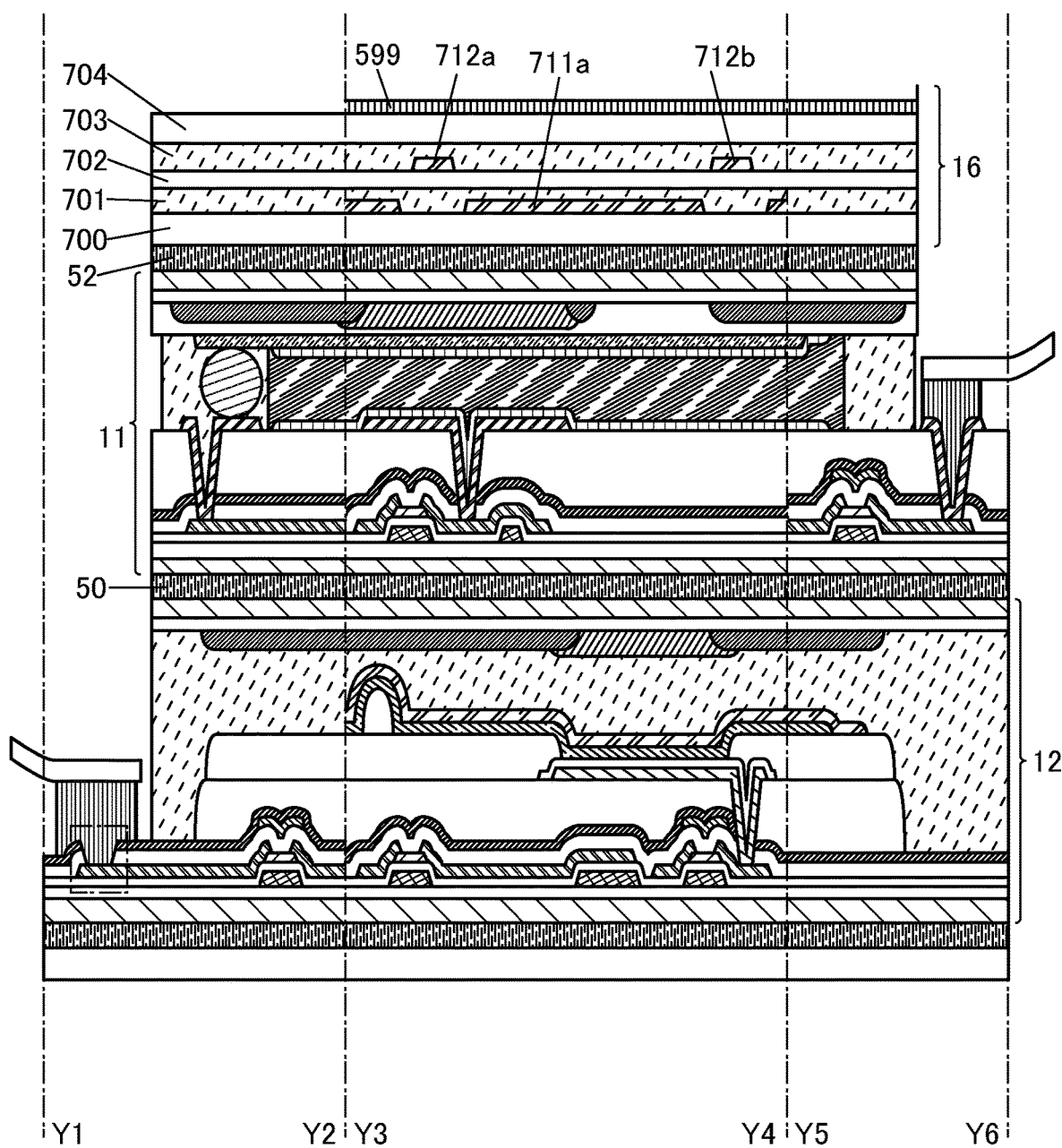
FIG. 7 A specific cross-sectional view of a display device of one embodiment of the present invention.

FIG. 7 shows an example of a cross-sectional view of the display device 10 in which an input device 16 is provided over the first display panel 11.

The input device 16 includes a substrate 700, a substrate 702, and a substrate 704. A conductive layer 711a is provided over the substrate 700. A conductive layer 712a and a conductive layer 712b are provided over the substrate 702. The substrate 700 and the substrate 702 are bonded to each other with an adhesive layer 701. The substrate 702 and the substrate 704 are bonded to each other with an adhesive layer 703. The polarizing plate 599 may be provided over the substrate 704.

The description of the substrate 201 and the substrate 202 can be referred to for materials that can be used for the substrate 700, the substrate 702, and the substrate 704.

The conductive layer 711a, the conductive layer 712a, and the conductive layer 712b each have a function of transmitting visible light. As their materials, an indium tin oxide ($In_2O_3$—$SnO_2$, abbreviated as ITO), indium tin oxide containing silicon or silicon oxide, indium zinc oxide, zinc oxide, or the like can be used.

Note that the sum of thicknesses t of the first display panel 11 and its attachments when the input device 16 is provided means the total thickness of components from the polarizing plate 599 to the adhesive layer 50 including the input device 16.

Embodiment 2

Structure Example

In this embodiment, a circuit structure example of the display device of one embodiment of the present invention will be described with reference to FIG. 8 and FIG. 9.

Figure 8A:
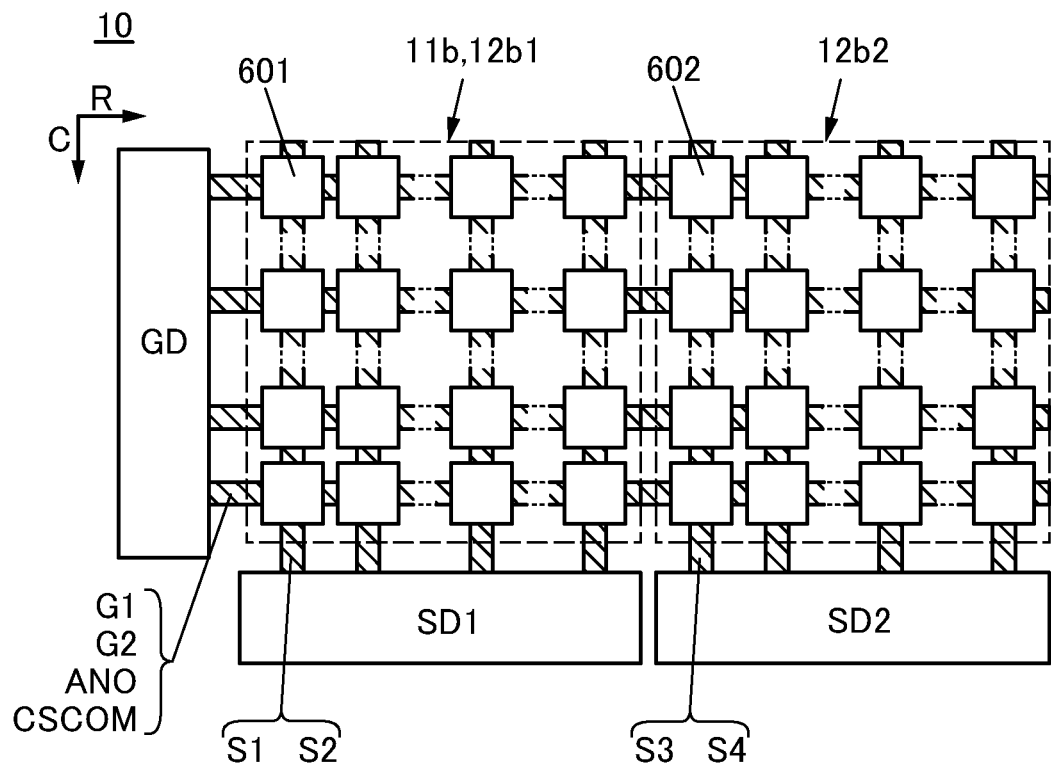

FIG. 8(A) is a block diagram illustrating a structure example of the display device 10. The display device 10 includes a plurality of pixels 602 arranged in matrix in the display portion 12b2, which is the non-overlap region 14, of the second display panel 12. The plurality of pixels 602 includes the light-emitting elements 130.

The display device 10 includes, in the overlap region 13, the display portion 11b of the first display panel 11 and the display portion 12b1 of the second display panel 12. The display device 10 includes, in the overlap region 13, a plurality of pixels 601 in which the liquid crystal element 220 of the display portion 11b overlaps with the light-emitting element 120 of the display portion 12b1. The plurality of pixels 601 is arranged in matrix. That is, the plurality of pixels 601 includes the reflective liquid crystal element 220 overlapping with the light-emitting element 120.

The display device 10 includes a circuit GD, a circuit SD1, and a circuit SD2. In addition, the display device 10 includes a plurality of wirings G1 and a plurality of wirings CSCOM, which electrically connect the circuit GD and the plurality of pixels 601 arranged in a direction R. In addition, the display device 10 includes a plurality of wirings G2 and a plurality of wirings ANO, which electrically connect the circuit GD, the plurality of pixels 601, and a plurality of pixels 602 arranged in the direction R. In addition, the display device 10 includes a plurality of wirings S1 and a plurality of wirings S2, which electrically connect the circuit SD1 and the plurality of pixels 601 arranged in a direction C. In addition, the display device 10 includes a plurality of wirings S3 and a plurality of wirings S4, which electrically connect the circuit SD2 and the plurality of pixels 602 arranged in the direction C.

Figure 8A:
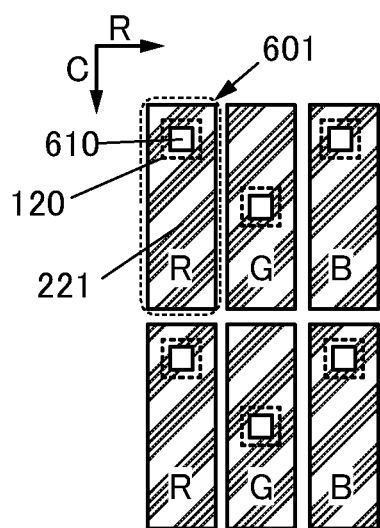
Figure 8A:
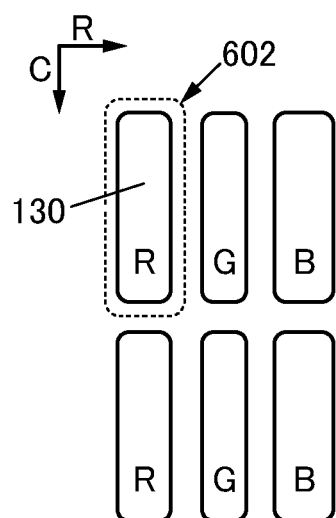

FIG. 8(B1) shows a structure example of the conductive layer 221 of the liquid crystal element 220 included in the pixel 601, and the light-emitting element 120. The conductive layer 221 serves as a reflective electrode of the liquid crystal element 220. An opening 610 is provided in the conductive layer 221. The light-emitting element 120 is shown by dashed lines.

As shown in FIG. 8(B1), the light-emitting element 120 is positioned to overlap with the opening 610 of the conductive layer 221. Thus, light emitted by the light-emitting element 120 is emitted to a viewing side through the opening 610.

In FIG. 8(B1), the pixels 601 adjacent in the direction R are pixels corresponding to different emission colors. As illustrated in FIG. 8(B1), in two pixels adjacent in the direction R, the openings 610 are preferably provided in different positions in the conductive layers 221 so as not to be aligned in one line. This allows two light-emitting elements 120 to be apart from each other, thereby preventing light emitted by the light-emitting element 120 from entering a coloring layer of the adjacent pixel 601 (such a phenomenon is also referred to as crosstalk). Since two adjacent light-emitting elements 120 can be arranged apart from each other, a high-resolution display device can be provided even when EL layers of the light-emitting elements 120 are separately formed with a shadow mask or the like.

If the ratio of the total area of the opening 610 to the total area excluding the opening is too large, display performed using the liquid crystal element is dark. If the ratio of the total area of the opening 610 to the total area excluding the opening is too small, display performed using the light-emitting element 120 is dark.

If the area of the opening 610 provided in the conductive layer 221 serving as a reflective electrode is too small, extraction efficiency of light emitted by the light-emitting element 120 is reduced.

The opening 610 can have, for example, a polygonal, quadrangular, elliptical, circular, or cross shape. Alternatively, the opening 610 may have a stripe shape, a slit shape, or a checkered pattern. The opening 610 may be provided close to the adjacent pixel. The opening 610 is preferably provided close to another pixel displaying the same color, in which case crosstalk can be suppressed.

FIG. 8(B1) shows a structure example of the light-emitting element 130 included in the pixel 602. The light-emitting element 130 included in the pixel 602 does not overlap with a liquid crystal element and can thus be wide. When the light-emitting element 130 is wide, power consumption of the display device 10 can be reduced. In FIG. 8(B2), it is preferable that the pixel 602 denoted by R be a red-light-emitting element, the pixel 602 denoted by G be a green-light-emitting element, and the pixel 602 denoted by B be a blue-light-emitting element. By increasing the area of an element emitting blue, which is difficult to obtain highly efficient emission, and by reducing the area of an element emitting green, which has high relative luminous efficiency, power consumption of the display device 10 can be further reduced or life of the display device 10 can be prolonged.

Circuit Structure Example

Figure 9:
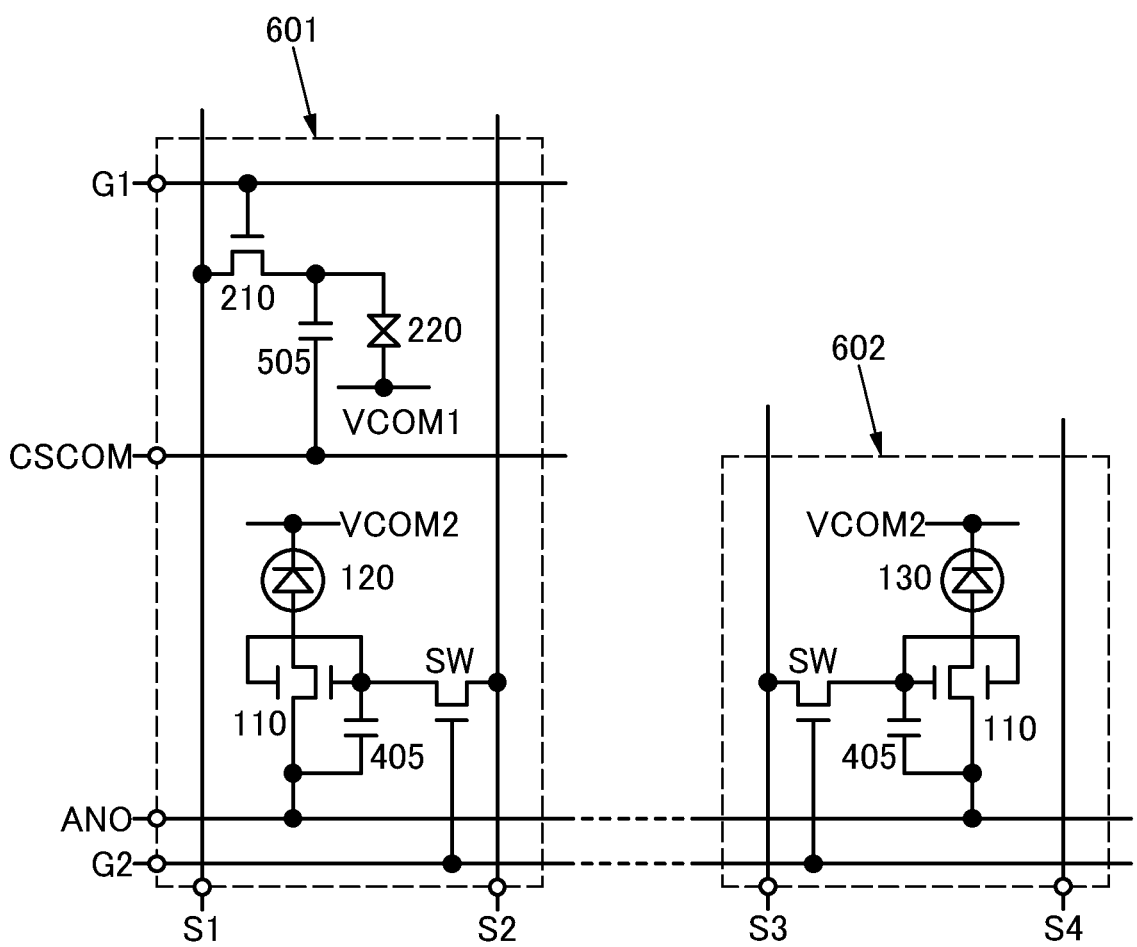
FIG. 9 A circuit diagram of a display device of one embodiment of the present invention.

FIG. 9 is an example of a circuit that can be used for the pixel 601 and the pixel 602.

The pixel 601 includes the transistor 210, the capacitor 505, the liquid crystal element 220, the transistor 110, a switch SW, the capacitor 405, the light-emitting element 120, and the like. The pixel 601 is electrically connected to the wiring G1, the wiring G2, the wiring ANO, the wiring CSCOM, the wiring S1, and the wiring S2. FIG. 9 illustrates a wiring VCOM1 electrically connected to the liquid crystal element 220, and a wiring VCOM2 electrically connected to the light-emitting element 120.

As for the transistor 210, a gate is connected to the wiring G1, one of a source and a drain is connected to the wiring S1, and the other of the source and the drain is connected to one electrode of the capacitor 505 and one electrode of the liquid crystal element 220. The other electrode of the capacitor 505 is connected to the wiring CSCOM. The other electrode of the liquid crystal element 220 is connected to the wiring VCOM1.

As for the switch SW, a gate is connected to the wiring G2, one of a source and a drain is connected to the wiring S2, and the other of the source and the drain is connected to one electrode of the capacitor 405 and a gate of the transistor 110. The other electrode of the capacitor 405 is connected to one of a source and a drain of the transistor 110 and the wiring ANO. The other of the source and the drain of the transistor 110 is connected to one electrode of the light-emitting element 120. The other electrode of the light-emitting element 120 is connected to the wiring VCOM2.

FIG. 9 illustrates an example in which the transistor 110 includes two gates between which a semiconductor is sandwiched and which are electrically connected to each other. This can increase current that can flow through the transistor 110.

A signal for controlling the on/off state of the transistor 110 can be supplied to the wiring G1. A predetermined potential can be supplied to the wiring VCOM1. A signal for changing the orientation of liquid crystals in the liquid crystal element 220 can be supplied to the wiring S1. A predetermined potential can be supplied to the wiring CSCOM.

A signal for controlling the on/off state of the switch SW can be supplied to the wiring G2. Potentials having a difference large enough to make the light-emitting element 120 emit light can be supplied to the wiring VCOM2 and the wiring ANO. A signal for controlling the conduction state of the transistor 110 can be supplied to the wiring S2.

In the case of performing display in the reflective mode, for example, the pixel 601 shown in FIG. 9 is driven with signals supplied to the wiring G1 and the wiring S1 to utilize the optical modulation of the liquid crystal element 220. In the case of performing display in the transmissive mode, the pixel is driven with signals supplied to the wiring G2 and the wiring S2, whereby the light-emitting element 120 emits light. In the case where both of the modes are performed at the same time, the pixel can be driven with the signals supplied to the wiring G1, the wiring G2, the wiring S1, and the wiring S2.

The pixel 602 includes the transistor 110, the switch SW, the capacitor 405, the light-emitting element 130, and the like. The description of the pixel 601 can be partly referred to for the electrical connection between the transistor 110, the switch SW, the capacitor 405, and the light-emitting element 130 and signals supplied to them.

FIG. 8 and FIG. 9 show the structure in which the display portion 12b1 and the display portion 12b2 are both controlled by the one circuit GD by sharing the wiring G2 and the wiring ANO. However, one embodiment of the present invention is not limited to this. A circuit for controlling the wiring G2 and the like may be provided for each of the display portion 11b, the display portion 12b1, and the display portion 12b2.

FIG. 8 and FIG. 9 show the structure in which the display portion 11b and the display portion 12b1 are both controlled by the one circuit SD; however, one embodiment of the present invention is not limited to this. A circuit for controlling the source line and the like may be provided in each of the display portion 11b and the display portion 12b1.

This embodiment can be implemented in combination with any of the other embodiments as appropriate.

Embodiment 3

In this embodiment, examples of an electronic appliance to which the display device of one embodiment of the present invention can be used will be described with reference to FIG. 10.

FIGS. 10(A1) and (A2) are diagrams showing a portable electronic appliance 800. The electronic appliance 800 includes a housing 801 provided with the display device 10, a speaker 802, an input-output terminal 803, and the like. An input device such as a touch panel is preferably provided over the overlap region 13 of the display device 10 for the improvement of the convenience to users of the electronic appliance 800. For another example, the electronic appliance 800 may have a function of switching images between the display portion 11b of the first display panel and the display portions 12b1 and 12b2 of the second display panel by the operation of the touch panel.

Light may be extracted from both surfaces of the second display panel 12. With the structure in which light can be extracted from both surfaces, as shown in FIG. 10(A2), even when the non-overlap region 14 is bent to overlap with the overlap region 13, display can be performed toward the viewing side in the non-overlap region 14. The display device of one embodiment of the present invention is used as the display device included in the electronic appliance 800, and the electronic appliance can have a large display portion and good portability.

FIG. 10(B1) is a diagram showing a portable electronic appliance 810. Like the electronic appliance 810, the electronic appliance may include the display device 10, a button-type input device 811, and an input device 812. The display device of one embodiment of the present invention is used as the display device included in the electronic appliance 810, and the electronic appliance can have a large display portion and good portability.

FIG. 10(B2) is a diagram showing a digital camera 820. The display device of one embodiment of the present invention is used as the display device included in the digital camera 820, and the digital camera can have a large display portion and good portability.

FIG. 10(C) is a diagram showing a computer 830. The computer 830 includes the display device 10, an input-output terminal 831, a speaker 832, an input-output terminal 833, and the like. The display device 10 included in the computer 830 preferably includes a touch panel over the overlap region 13. The overlap region 13 is preferably provided in the same housing where a keyboard 834 is provided. The computer 830 including a touch panel over the overlap region 13 and provided in the same housing where the keyboard 834 is provided can have an improved operability. In addition, the computer 830 can have a large display portion and good portability.

As described above, the display device of one embodiment of the present invention can be used in various electronic appliances and information display means.

This embodiment can be implemented in combination with any of the other embodiments as appropriate.

DESCRIPTION OF NUMERALS 10 display device
11 first display panel
11a peripheral portion
11b display portion
12 second display panel
12a peripheral portion
12b1 display portion
12b2 display portion
13 overlap region
14 non-overlap region
15 bent portion
16 input device
20 housing
21 light
22 reflected light
50 adhesive layer
51 adhesive layer
101 resin layer
102 resin layer
110 transistor
111 conductive layer
112 semiconductor layer
113a conductive layer
113b conductive layer
120 light-emitting element
121 conductive layer
122 EL layer
123 conductive layer
130 light-emitting element
131 insulating layer
132 insulating layer
133 insulating layer
134 insulating layer
135 insulating layer
141 insulating layer
151 adhesive layer
152 coloring layer
153 light-blocking layer
201 substrate
202 substrate
204 insulating layer
210 transistor
211 conductive layer
212 semiconductor layer
213a conductive layer
213b conductive layer
220 liquid crystal element
221 conductive layer
222 liquid crystal
223 conductive layer
224a alignment film
224b alignment film
231 insulating layer
232 insulating layer
233 insulating layer
234 insulating layer
351 substrate
372 FPC
374 FPC
400 conductive layer
401 transistor
402 transistor
405 capacitor
406 connection portion
414 insulating layer
419 connection layer
501 transistor
505 capacitor
506 connection portion
514 insulating layer
517 adhesive layer
519 connection layer
543 connector
550 resin
551 adhesive
565 coloring layer
566 light-blocking layer
567 insulating layer
599 polarizing plate
601 pixel
602 pixel
610 opening
700 substrate
701 adhesive layer
702 substrate
703 adhesive layer
704 substrate
711a conductive layer
712a conductive layer
712b conductive layer
800 electronic appliance
801 housing
802 speaker
803 input-output terminal
810 electronic appliance
811 input device
812 input device
820 digital camera
830 computer
831 input-output terminal
832 speaker
833 input-output terminal
834 keyboard

What is claimed is:

1. An electronic device comprising:
a first display panel; and
a second display panel,
wherein the first display panel comprises a first transistor over a first substrate and a light-emitting element electrically connected to the first transistor,
wherein the second display panel comprises a second substrate and a second transistor provided over the second substrate,
wherein the second substrate comprises glass,
wherein the first display panel and the second display panel overlap each other,
wherein, in a state where a display surface of the first display panel is flat, the display surface of the first display panel comprises a first region overlapping with a display surface of the second display panel and a second region not overlapping with the display surface of the second display panel,
wherein, in a state where the display surface of the first display panel is bent, the second region of the first display panel and the first region of the first display panel are configured to overlap each other,

19 wherein, in the state where the display surface of the first display panel is bent, the electronic device comprises a member that protects a region having a curvature of the display surface of the first display panel and is provided between a third region of the display surface of the first display panel and a fourth region of the display surface of the first display panel, wherein, in a cross-sectional view of the electronic device, an outer edge of the member has a region having a curvature, wherein, in the cross-sectional view of the electronic device, the region having a curvature of the display surface of the first display panel is provided to surround the region having a curvature of the outer edge of the member in the state where the display surface of the first display panel is bent, wherein, in the state where the display surface of the first display panel is flat, the first display panel is configured to display an image via light emission of the light-emitting element towards a side where the member is provided, and wherein, in the direction in which the light is emitted, the member is exposed.

2. The electronic device according to claim 1,
wherein an area of the first display panel is larger than an area of the second display panel.

3. The electronic device according to claim 1,
wherein the member does neither expand nor contract when the first display panel is bent.

4. An electronic device comprising:
a first display panel; and
a second display panel,
wherein the first display panel comprises a first transistor over a first substrate and a light-emitting element electrically connected to the first transistor,
wherein the second display panel comprises a second substrate and a second transistor provided over the second substrate,
wherein the second substrate comprises glass,
wherein the first display panel and the second display panel overlap each other,
wherein, in a state where a display surface of the first display panel is flat, the display surface of the first display panel comprises a first region overlapping with a display surface of the second display panel and a second region not overlapping with the display surface of the second display panel,
wherein, in a state where the display surface of the first display panel is bent, the second region of the first display panel and the first region of the first display panel are configured to overlap each other,
wherein, in the state where the display surface of the first display panel is bent, the electronic device comprises a member that protects a region having a curvature of the display surface of the first display panel and is provided between a third region of the display surface of the first display panel and a fourth region of the display surface of the first display panel,
wherein, in a cross-sectional view of the electronic device, an outer edge of the member has a region having a curvature,
wherein, in the cross-sectional view of the electronic device, the region having a curvature of the display surface of the first display panel is provided to surround the region having a curvature of the outer edge of the member in the state where the display surface of the first display panel is bent, and

20 wherein, in the state where the display surface of the first display panel is flat, the first display panel is configured to display an image via light emission of the light-emitting element towards a side where the member is provided.

5. The electronic device according to claim 4,
wherein an area of the first display panel is larger than an area of the second display panel.

6. The electronic device according to claim 4,
wherein the member does neither expand nor contract when the first display panel is bent.

7. An electronic device comprising:
a first display panel; and
a second display panel,
wherein the first display panel comprises a first transistor over a first substrate and a light-emitting element electrically connected to the first transistor,
wherein the second display panel comprises a second substrate and a second transistor provided over the second substrate,
wherein the second substrate comprises glass,
wherein the first display panel and the second display panel overlap each other,
wherein, in a state where a display surface of the first display panel is flat, the display surface of the first display panel comprises a first region overlapping with a display surface of the second display panel and a second region not overlapping with the display surface of the second display panel,
wherein, in a state where the display surface of the first display panel is bent, the second region of the first display panel and the first region of the first display panel are configured to overlap each other,
wherein, in the state where the display surface of the first display panel is bent, the electronic device comprises a member that protects a region having a curvature of the display surface of the first display panel and is provided between a third region of the display surface of the first display panel and a fourth region of the display surface of the first display panel,
wherein, in a cross-sectional view of the electronic device, an outer edge of the member has a region having a curvature,
wherein, in the cross-sectional view of the electronic device, the region having a curvature of the display surface of the first display panel is provided to surround the region having a curvature of the outer edge of the member in the state where the display surface of the first display panel is bent,
wherein the light-emitting element comprises:
a first conductive layer;
an EL layer over the first conductive layer; and
a second conductive layer,
wherein the first transistor is electrically connected to the first conductive layer,
wherein the first transistor comprises:
a first gate electrode over a first insulating layer;
a second insulating layer over the first gate electrode;
a semiconductor layer over the second insulating layer, the semiconductor layer comprising a metal oxide;
a source electrode and a drain electrode provided over and electrically connected to the semiconductor layer;
a third insulating layer over the semiconductor layer; and
a second gate electrode over the third insulating layer, wherein a third conductive layer is provided over the first insulating layer,
wherein the third conductive layer is formed from a same layer as the first gate electrode,
wherein the third conductive layer is configured to function as a first electrode of a capacitor, and
wherein the first conductive layer of the light-emitting element overlaps with the first gate electrode and the third conductive layer.

8. The electronic device according to claim 7,
wherein an area of the first display panel is larger than an area of the second display panel.

9. The electronic device according to claim 7,
wherein the member does neither expand nor contract when the first display panel is bent.

* * * * *